US008466720B2

(12) United States Patent
Gupta

(10) Patent No.: US 8,466,720 B2
(45) Date of Patent: Jun. 18, 2013

(54) FREQUENCY DIVISION OF AN INPUT CLOCK SIGNAL

(75) Inventor: Nitin Gupta, Kurukshetra (IN)

(73) Assignee: STMicroelectronics International N.V., Amsterdam (NL)

( * ) Notice: Subject to any disclaimer, the term of this patent is extended or adjusted under 35 U.S.C. 154(b) by 48 days.

(21) Appl. No.: 13/177,956

(22) Filed: Jul. 7, 2011

(65) Prior Publication Data

US 2012/0161823 A1    Jun. 28, 2012

(30) Foreign Application Priority Data

Dec. 28, 2010    (IN) .............................. 3126/DEL/2010

(51) Int. Cl.
*H03B 19/00*    (2006.01)
(52) U.S. Cl.
USPC .......................................... 327/117; 327/115

(58) Field of Classification Search
USPC .................................. 327/115, 117, 254, 255
See application file for complete search history.

(56) References Cited

U.S. PATENT DOCUMENTS

| 6,157,693 | A  | * | 12/2000 | Jayaraman ...................... 377/47 |
| 7,233,181 | B2 | * | 6/2007 | Osako .......................... 327/115 |
| 7,587,019 | B2 | * | 9/2009 | Yu et al. ......................... 377/47 |
| 7,719,326 | B2 | * | 5/2010 | Casagrande et al. .......... 327/115 |

* cited by examiner

*Primary Examiner* — Hai L Nguyen
(74) *Attorney, Agent, or Firm* — Wolf, Greenfield & Sacks, P.C.

(57) ABSTRACT

Circuitry and method for dividing the frequency of an input clock signal for use in a prescaler of a digital frequency synthesizer. A flip flop is clocked on a first type of edge of the input clock signal, and provides an output for use as a divided clock signal. Feedback circuitry is clocked on the first type of edge of the input clock signal and provides a signal to a data input of the flip flop based on the inverse of the output of the flip flop.

23 Claims, 14 Drawing Sheets

FREQUENCY DIVISION OF AN INPUT CLOCK SIGNAL

CROSS REFERENCE TO RELATED APPLICATIONS

This application claims the priority benefit of Indian patent application number 3126/Del/2010, filed on Dec. 28, 2010, entitled FREQUENCY DIVISION OF AN INPUT CLOCK SIGNAL, which is hereby incorporated by reference to the maximum extent allowable by law.

BACKGROUND OF THE INVENTION

1. Field of the Invention

The present invention relates to frequency division of an input clock signal. In particular, the present invention relates to circuitry for dividing the frequency of an input clock signal for use in a prescaler of a digital frequency synthesizer.

2. Discussion of the Related Art

Digital frequency synthesizer circuits, such as phase locked loop (PLL) digital frequency synthesizer circuits, are operable at high speeds and are typically used in digital mobile communication devices. A conventional PLL frequency synthesizer circuit includes a frequency divider which has a prescaler, such as a dual modulus prescaler. A prescaler is used to generate narrowly-spaced frequencies at frequencies which are too high to be reliably passed through a feedback system of a device. A dual modulus prescaler selectively frequency divides a frequency signal (e.g. an input clock signal from a voltage controlled oscillator (VCO)) by either a frequency dividing ratio k or a frequency-dividing ratio (k+x) to supply a frequency-divided signal. The modulus of a prescaler is its division ratio. A dual modulus prescaler can divide by two different factors, such as k and k+x. x may be positive or negative, and may for example be 1. A control input can be used to switch the factor used by the prescaler between k and k+x.

One example of a dual modulus prescaler which is based on a shift register ring is shown in FIG. 1a. The flip flops (102, 104, 106, 112 and 116) FIG. 1a are initialized to output high signals. FIG. 1b shows a timing diagram of signals output from the flip flops 102, 104, 106 and 116 in the dual-modulus prescaler of FIG. 1a when M is set to 0. It can be seen that when M is set to 0 the output signal has a frequency which is eight times less than the frequency of the input clock signal. FIG. 1c shows a timing diagram of signals output from the flip flops 102, 104, 106, 112 and 116 in the dual-modulus prescaler of FIG. 1a when M is set to 1. It can be seen that when M is set to 1 the output signal has a frequency which is nine times less than the frequency of the input clock signal.

Another example of a dual modulus prescaler is shown in FIG. 2a which uses cascaded divide-by-two stages (202, 204 and 206), as described in "High-Speed Architecture for a Programmable Frequency Divider and a Dual-Modulus Prescaler" by Patrik Larsson, IEEE Journal on Solid-State Circuits, VOL. 31, No. 5, May 1996. The one detector 208 gives a low output pulse when the M signal and the outputs of all divide-buy-two stages (202, 204 and 206) are high. This pulse is delayed one clock cycle and synchronized with the inverted input clock signal in the D flip-flop 212. The input clock signal may, for example, be received from a voltage controlled oscillator (VCO). A low output from the D flip flop 212 will prohibit one negative pulse of the Clk signal from reaching the first divide-by-two stage 202. After cancelling one clock pulse, it will take eight clock pulses before the one detector 208 output goes low, giving a division ratio of nine. By setting M low, the detector output is always high and the prescaler divides by eight. Therefore the circuit operates as an 8/9 prescaler, using M as the control signal, but can be easily modified to a $2^b/2^b+1$ prescaler by adding or removing divide-by-two stages thereby extending or shortening the detector. FIG. 2b shows a timing diagram of signals output from the divide-by-two stages 202, 204 and 206 and from the D flip flop 212 in the dual-modulus prescaler of FIG. 2a when M is set to 0. It can be seen that when M is set to 0 the output signal has a frequency which is eight times less than the frequency of the input clock signal. FIG. 1c shows a timing diagram of signals output from the divide-by-two stages 202, 204 and 206 and from the D flip flop 212 in the dual-modulus prescaler of FIG. 1a when M is set to 1. It can be seen that when M is set to 1 the output signal has a frequency which is nine times less than the frequency of the input clock signal.

SUMMARY OF THE INVENTION

The prescalers of the prior art, such as those described above, which employ a clock pulse swallowing technique, work in half cycle operation of the clock signal. For example, it can be seen in FIG. 2a that the D flip flop 212 is clocked using the falling edges of the input clock signal (due to the inverter 210), to thereby swallow one rising edge of the clock input using the transistor 216. The rising edge of the clock signal is swallowed in the sense that it is blocked from reaching the Div 2 block 202. It can be appreciated that the prescaler shown in FIG. 2a relies on half clock cycle operation in order to function correctly. In other words it is necessary that the D flip-flop 212 is clocked using the falling edge of the clock signal rather than the rising edge, whilst other components (e.g. transistor 214) are clocked using the opposite edge, i.e. the rising edge. Therefore the timing of both rising and falling edges of the input clock signal affect the operation of the prescaler shown in FIG. 2a, and as such the operation of the prescaler shown in FIG. 2a is dependent upon the duty cycle of the input clock signal.

Since the prescaler shown in FIG. 2a relies upon the timing of both the rising edges and the falling edges of the input clock signal, the duty cycle of the input clock signal received from the VCO directly impacts the operation of the prescaler. In particular, the dependence of the prior art prescalers on the duty cycle of the input clock signal impacts on (i.e. limits) the maximum speed at which the prescaler can operate. It may be beneficial for a different mechanism to the clock swallowing mechanism of the prior art to be used in a prescaler so that it would be possible for the prescaler to operate independently of the duty cycle of the input clock signal. This can be advantageous in many different implementations, in particular when operating at the high frequencies that prescalers use in digital frequency synthesizer circuits in digital mobile communication devices. Embodiments of the present invention implement prescaler circuitry whose operation depends upon the frequency of the input clock signal, but does not depend upon the duty cycle of the input clock signal.

In a first aspect there is provided circuitry for dividing the frequency of an input clock signal for use in a prescaler of a digital frequency synthesizer, the circuitry comprising: a flip flop configured to be clocked on a first type of edge of the input clock signal, and configured to provide an output for use as a divided clock signal; and feedback circuitry configured to be clocked on the first type of edge of the input clock signal and configured to: receive the output of the flip flop; provide a signal to a data input of the flip flop based on the output of the flip flop; and receive at least one control signal which determines a mode of the circuitry, wherein in a first mode the feedback circuitry is arranged to allow the signal provided to the data input of the flip flop to follow the inverse of the output of the flip flop so that each first type of edge causes the signal provided to the data input of the flip flop to toggle such that the output of the flip flop has a frequency which is substantially half of the frequency of the input clock signal, and wherein in a second mode the feedback circuitry is arranged to allow the signal provided to the data input of the flip flop to follow the inverse of the output of the flip flop with the exception that toggling of the signal provided to the data input of the flip flop is selectively prevented despite toggling of the output of the flip flop on an edge of the first type such that the output of the flip flop has a frequency which is at most a third of the frequency of the input clock signal, wherein the feedback circuitry is arranged to operate independently from a second type of edge of the input clock signal in providing the signal to the data input of the flip flop, the second type of edge being the opposite of the first type of edge of the input clock signal, such that the output of the flip flop is independent from the duty cycle of the input clock signal.

The first mode is an unblocking mode in which the output from the flip flop has a frequency which is substantially half of the frequency of the input clock signal. The second mode is a blocking mode in which the data input to the flip flop is prevented from toggling at least once in a cycle.

At least one embodiment removes the half cycle path in the prescaler and thus prevents blocking of the input clock signal on the clock input of the flip flop. This helps to avoid bad slopes, pulse width violations and voltage swings at the input of divide-by-two blocks. There is no logic in the path of the input clock signal, such that the input clock signal is not blocked. Furthermore, as described above, there is no half cycle operation, thus there is no dependency on the duty cycle of the input clock signal. There is no half cycle operation because the clocking of the circuitry is performed using only the first type of edge of the input clock signal (e.g. the falling edges). In other words, there is no clocking of the circuitry using the second type of edge of the input clock signal (e.g. the rising edges). Therefore, provided that the frequency of the input clock signal and the timing of the edges of the first type (e.g. falling edges) are not affected, altering the timing of the edges of the second type (e.g. rising edges) would not affect the operation of the circuitry (i.e. the operation of the circuitry is independent from the duty cycle of the input clock signal).

The circuitry of embodiments operates as a divide-by-two block when it is operating in the first mode (e.g. when there is no block signal), but when it is operating in the second mode (e.g. when a block signal is received as one of the control signals), the signal applied to the data input of the flip flop is forcefully held to prevent toggling of the output of the circuitry. In this way, in the second mode the frequency of the divided clock signal output from the flip flop is $$\left(\frac{1}{2+y}\right)$$

of the frequency of the input clock signal where y is the number of times during one cycle for which the data input of the flip flop is forcefully prevented from toggling. So, for example, where y is 1, toggling is prevented once during each cycle such that the frequency of the divided clock signal output from the flip flop is a third of the frequency of the input clock signal.

The term "cycle" is used to mean the operations performed by the circuitry during one time period of the divided clock signal output from the flip flop. In other words, a "cycle" is a block of operations that are repeatedly performed by the circuitry during operation.

Dedicated start up circuitry may be required in the prior art to place a prescaler in a functional state. Without such dedicated start up circuitry, prescalers of the prior art can become stuck and may not function correctly. As an example, the prescaler shown in FIG. 2a can become stuck in the divide-by-three mode (i.e. when M=1) but not in the divide-by-two mode (when M=0). If the prescaler shown in FIG. 2a is started up with M set to a high value, the output of each Div 2 block set to a high value and the output of the D flip flop set to a low value then the circuit is in a stuck state. The transistor 216 does not allow current to flow through it since the output of the D flip flop is low, such that a low signal is never received at the first Div 2 block 202, so the outputs of all of the Div 2 blocks (202, 204 and 206) stay high such that the input to the D flip flop 212 from the one detector 208 stays low, such that, as described above, the transistor 216 does not allow current to flow through it. This means that the Div 2 blocks 202, 204 and 206 do not receive an edge of the clock signal (due to the blocking by transistor 216) and so the outputs of the Div 2 blocks 202, 204 and 206 do not change.

Stuck states such as the one described above in relation to FIG. 2a can occur because the input clock signal is blocked. In embodiments, there is no blocking to the input clock signal. In other words, the circuitry is arranged such that the input clock signal is received directly at the flip flop without being blocked. Since the input clock signal is directly received at the flip flop, dedicated start up circuitry is not required. Advantageously, the circuitry will self resolve itself during startup. Since dedicated start up circuitry is not required, the amount and the complexity of the hardware of the circuitry are reduced compared to prior art prescalers. As described in more detail below, some prescalers include a 50% duty cycle (50 D) module such that the divided clock signal output from the prescaler has a 50% duty cycle. Such 50 D modules may have more than one state in which they can get stuck (i.e. they have multiple stuck states). The circuitry of embodiments of the invention is particularly advantageous when used in a 50 D module since it avoids the need for start up circuitry for the multiple stuck states of a 50 D module.

The concept may also be extended to a 50% duty cycle (50 D) prescaler to provide a high speed modular prescaler as compared to the prior art. For 50 D prescalers, toggling of the output is blocked depending on two least significant bits (LSBs), p0 and p1, to achieve a desired frequency division of the input clock signal. The two bits, p0 and p1, provide a binary representation of the amount of blocking to be applied to the input clock signal. The two p-bits can therefore be thought of as a binary counter. For example, in one 50 D module of a prescaler the input clock signal is divided by four if there is no extra blocking of the clock signal. The 50 D module may comprise two divide-by-two blocks, to output a clock signal which has a frequency which is a quarter of the frequency of the input clock signal. In an embodiment, the p-bits (p0 and p1) indicate how many times the clock signal is to be blocked or prevented from toggling in each cycle, such that:
  if p1=0 and p0=0, no blocking occurs and the output signal has a frequency which is ¼ of the frequency of the input clock signal;
  if p1=0 and p0=1, the clock signal is blocked once per cycle, so that the output signal has a frequency which is ⅕ of the frequency of the input clock signal;

if p1=1 and p0=0, the clock signal is blocked twice per cycle, so that the output signal has a frequency which is ⅙ of the frequency of the input clock signal; and if p1=1 and p0=1, the clock signal is blocked three times per cycle (two blocking structures may be required), so that the output signal has a frequency which is ⅐ of the frequency of the input clock signal.

The output signal of the 50 D module has a 50% duty cycle. The use of a second divide-by-two block to provide the output from the module means that the output has substantially a 50% duty cycle. When dividing the input clock signal by an even number, n (e.g. where n is 4 or 6) then the duty cycle of the output divided clock signal has a 50% duty cycle, i.e. the high time is the same as the low time of the output signal over a period of the output signal. However, when the input clock signal is divided by an odd number then the output divided clock signal does not strictly have a 50% duty cycle. For example, dividing the frequency of the input clock signal by five results in the output clock signal having 2 cycles of HIGH TIME and 3 cycles of LOW TIME or vice-versa. In fact, when dividing the frequency of the input clock signal by an odd number n, the duty cycle, D, of the output divided clock signal from the 50 D module is given by $$D = \frac{n \pm 1}{2n}.$$

There is a further problem with the prior art. If the programmable bits which determine the factor by which the input clock signal is to be divided are changed on the fly, then glitches may occur on the output clock signal. For example, in the prior art prescaler shown in FIG. 2a, the timing of changes to the M signal (which provides a control signal, similar to the p-bits mentioned above) are not synchronized with the clock signal. Therefore, changes to M which are made on the fly (i.e. during operation of the prescaler) may occur at any phase throughout the cycle of the clock signal. As such, there will be a high probability that the input clock signal for the Div 2 block will be of high frequency leading to high frequency glitches at the output (which may be greater than the switching range) of the prescaler.

Embodiments provide a solution to the high frequency glitches of the prior art described above. If the p-bits are changed on the fly, there will be a glitch (which can be greater than the operating range of prescaler) at the data input of the flip flop. However, the is input clock signal is received directly at the clock input of the flip flop such that the output of the flip flop is synchronized with the input clock signal. Therefore, although there may be glitches at the data input of the flip flop, there will not be an erroneous high frequency signal at the output of the flip flop, thus the prescaler can be easily placed as an output divider of a PLL with no additional hardware required. Intermediate frequencies may be seen at the output of the circuitry, but that is normally acceptable in most PLL applications even though, as explained above high frequencies may be seen at the data input of the flip flop. In this way, any glitches on the data input to the flip flop from the feedback circuitry will not be passed to the output of the flip flop as the flip flop is clocked by the input clock signal. This deals with the problem of high frequency glitches when the p-bits are changed on the fly without requiring additional circuitry dedicated to handling such glitches.

In a second aspect, there is provided a modular frequency divider comprising a sequence of cells connected in series, the plurality of cells comprising: a first cell comprising circuitry according to the first aspect in which the feedback circuitry comprises a divide-by-two block for dividing the block output signal by two to thereby provide a final output signal; and at least one second cell comprising circuitry according to the first aspect in which the feedback circuitry is arranged to provide a block output signal, wherein the divided clock signal output from the flip flop of the circuitry of the first cell is arranged to provide the input clock signal for a first of the at least one second cell in the sequence, and wherein the block output signal from the first of the at least one second cell is arranged to provide one of the at least one control signals to the feedback circuitry of the first cell.

In a third aspect, there is provided a method of dividing the frequency of an input clock signal for use in a prescaler of a digital frequency synthesizer, the method comprising: clocking a flip flop on a first type of edge of the input clock signal, to provide an output for use as a divided clock signal; using feedback circuitry to provide a signal to a data input of the flip flop based on the output of the flip flop; determining a mode of the feedback circuitry wherein in a first mode the signal provided to the data input of the flip flop is allowed to follow the inverse of the output of the flip flop so that each first type of edge causes the signal provided to the data input of the flip flop to toggle such that the output of the flip flop has a frequency which is substantially half of the frequency of the input clock signal, and wherein in a second mode the signal provided to the data input of the flip flop is allowed to follow the inverse of the output of the flip flop with the exception that toggling of the signal provided to the data input of the flip flop is selectively prevented despite toggling of the output of the flip flop on an edge of the first type such that the output of the flip flop has a frequency which is at most a third of the frequency of the input clock signal, wherein the feedback circuitry operates independently from a second type of edge of the input clock signal in providing the signal to the data input of the flip flop, the second type of edge being the opposite of the first type of edge of the input clock signal, such that the output of the flip flop is independent from the duty cycle of the input clock signal.

BRIEF DESCRIPTION OF THE DRAWINGS

For a better understanding of the present invention and to show how the same may be put into effect, reference will now be made, by way of example, to the following drawings in which:

FIG. 1b is a first timing diagram of signals in the prescaler of FIG. 1a;

FIG. 1c is a second timing diagram of signals in the prescaler of FIG. 1a;

FIG. 2b is a first timing diagram of signals in the prescaler of FIG. 2a;

FIG. 2c is a second timing diagram of signals in the prescaler of FIG. 2a;

DETAILED DESCRIPTION

Embodiments will now be described by way of example only.

Figure 3A:
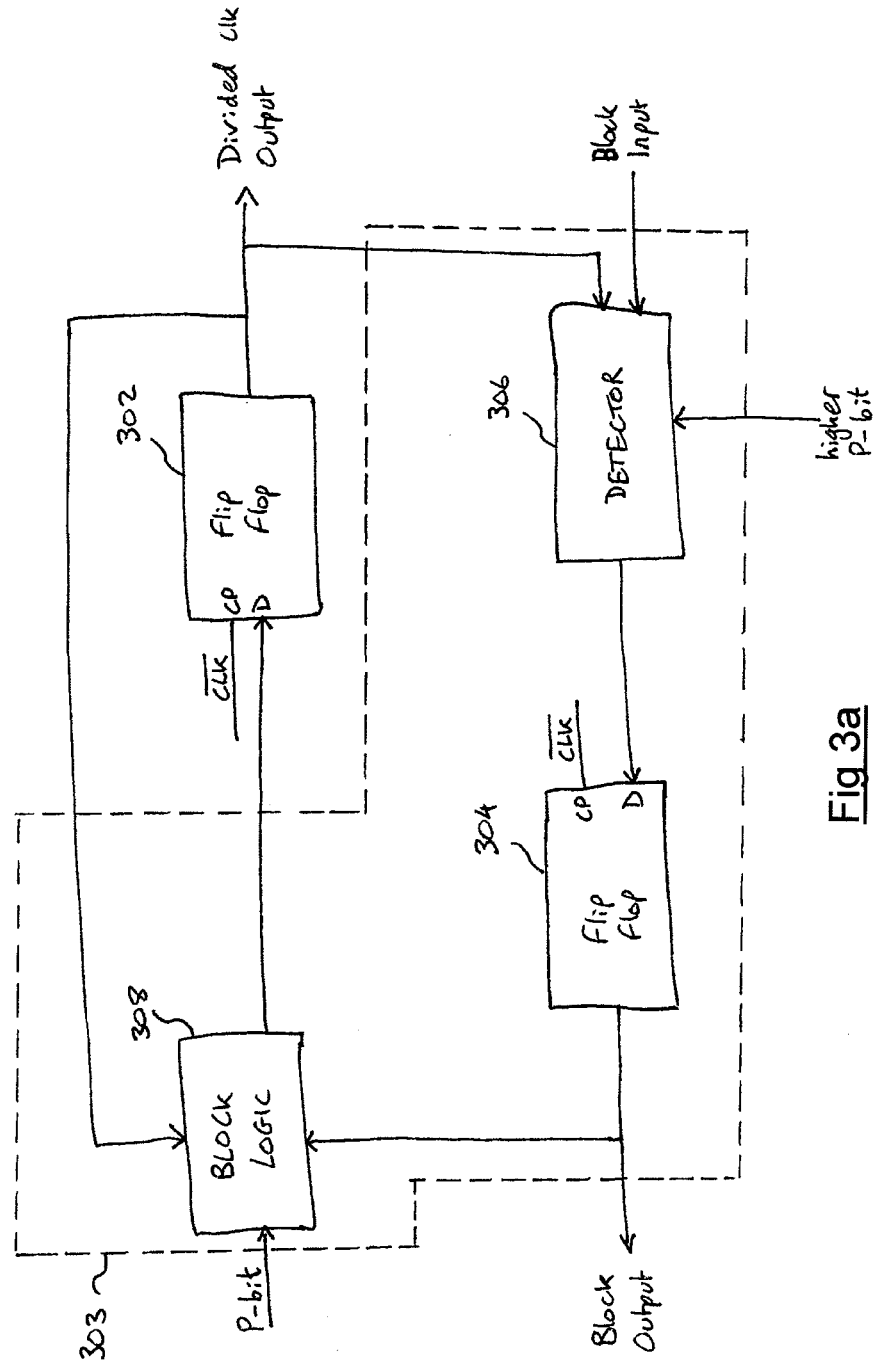
FIG. 3a shows a bit cell 2/3 architecture according to an embodiment.

One embodiment of circuitry for providing a 2/3 divider cell (which divides the frequency of an input clock signal by either two or three) is described herein with reference to FIG. 3. The circuitry shown in FIG. 3a comprises a first flip flop 302, a second flip flop 304, a detector block 306 and block logic 308.

The inverse of the input clock signal $\overline{CLK}$ is coupled to the clock inputs of the first and second flip flops 302 and 304. The output of the block logic 308 is coupled to the data input of the first flip flop 302. The output of the first flip flop 302 is provides an output signal, denoted "Divided clk output" in FIG. 3a. The output of the first flip flop 302 is also coupled to a first input of the logic block 308. The output of the first flip flop 302 is also connected to a first input of the detector block 306. A block input signal is coupled to a second input of the detector block 306. The output of the detector block 306 is coupled to the data input of the second flip flop 304. The output of the second flip flop 304 provides a block output signal. The output of the second flip flop 304 is also coupled to a second input of the logic block 308. A programmable control bit denoted "P-bit" in FIG. 3a is coupled to a third input of the block logic 308. A signal providing an indication of other "higher" programmable bits may be input to the detector block 306. This signal (denoted "higher P-bit" in FIG. 3a) is used when the cell shown in FIG. 3a is part of a series of cells as described in more detail below in relation to FIG. 5.

The circuitry shown in FIG. 3a other than the first flip flop 302 can be thought of as feedback circuitry, as shown in dotted box 303. In operation the feedback circuitry acts such that the block logic 308 provides either an inverted version of the output of the first flip flop 302 or the block output signal to the data input of the first flip flop 302 in dependence upon the value of the P-bit and the block input signal. The signal output from the first flip flop 302 (Divided clk output) is a signal which has a frequency which is either two or three times less to than the frequency of the input clock signal CLK depending upon the value of the P-bit.

Figure 5:
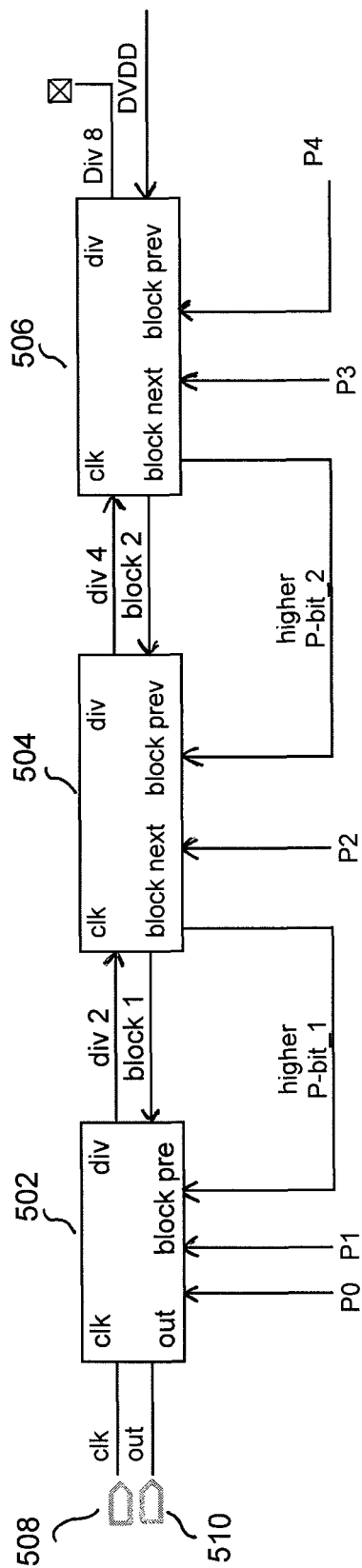
FIG. 5 shows a high speed 5-bit dual modulus prescaler architecture according to preferred embodiments.

The block logic 308 is arranged to operate such that if the P-bit is low, or if the block output signal is high, then the signal provided to the data input of the first flip flop 302 follows an inverted version of the output of the first flip flop 302. However, the block logic 308 is arranged to operate such that if the P-bit is high and the block output signal is low then the signal provided to the data input of the first flip flop 302 is low. The detector block 306 is arranged to operate such that if the block input signal is low then the output of the detector block 306 is high, whereas if the block input signal is high then the output of the detector block 306 is the inverse of the signal output from the first flip flop 302. When the circuitry shown in FIG. 3a is operated in isolation the block input signal is arranged to be high (e.g. the block input signal may be connected to the supply voltage DVDD). However, when the circuitry shown in FIG. 3a is implemented in a cell which is a part of a series of cells as shown in FIG. 5 and described in more detail below, the block input signal is brought high or low in accordance with a block output signal from another cell in the series. In this way, as described in more detail below, a cell including the circuitry shown in FIG. 3a can take account of the output of other cells to thereby divide the input clock signal by more than three.

When the P-bit is low then the bit cell shown in FIG. 3a provides an output on the Divided clk output which has a frequency which is half of that of the input clock signal CLK. This is because when the P-bit is low the block logic 308 acts to provide to the data input of the first flip flop 302 an inverted version of the output from the first flip flop 302. The precise mechanism for providing the inverted version of the output of the first flip flop 302 to the data input of the first flip flop 302 when the P-bit is low may be implemented in different ways by the block logic 308 as would be apparent to a person skilled in the art. In this way, when the output from the first flip flop 302 is low, the input to the data input of the first flip flop 302 is brought high by the block logic 308. This results in the output of the first flip flop 302 being brought high (such that the Divided clk output signal is brought high) on the next falling edge of the input clock signal CLK. Therefore, the input to the data input of the first flip flop 302 is brought low by the block logic 308. This results in the output of the first flip flop 302 being brought low (such that the Divided clk output signal is brought low) on the next falling edge of the input clock signal CLK. Therefore, as described above, when the P-bit is low the bit cell shown in FIG. 3a provides the Divided clk output which has a frequency which is half of that of the input clock signal CLK.

However, when the P-bit is high then the Divided clk output signal provided by the bit cell shown in FIG. 3a has a frequency which is a third of that of the input clock signal CLK, as explained below with reference to FIG. 3b which shows a timing diagram of the Divided clk output signal, the block output signal and the output of the block logic 308. The Divided clk output goes high on a falling edge of the input clock signal. Initially, the block output signal is high so the block logic 308 acts to provide the inverse of the Divided clk output signal to the data input of the first flip flop 302. Therefore on the second falling edge of the input clock signal CLK the output of the first flip flop 302 is brought low. When the output of the first flip flop 302 is high after the first falling edge of the input clock signal CLK, since the block input signal is high then the output of the detector block 306 goes low. Therefore on the second falling edge of the input clock signal the block output signal from the second flip flop 304 goes low. As described above, when the block output signal is low and the P-bit is high then the block logic 308 acts to provide a low signal to the data input of the first flip flop 302. Therefore on the third falling edge of the input clock signal CLK the output of the first flip flop 302 remains low. However, since after the second falling edge of the input clock signal CLK the output of the first flip flop 302 is low, the output of the detector block 306 is brought high. Therefore, on the third falling edge of the input clock signal CLK the block output signal from the second flip flop 304 is brought high. Therefore after the third falling edge of the input clock signal CLK the circuitry shown in FIG. 3a is in the same state as before the first falling edge of the input clock signal CLK shown in FIG. 3b, and the operation repeats such that the Divided clk output has a frequency which is a third of the frequency of the input clock signal CLK.

It can therefore be seen that the circuitry shown in FIG. 3a acts as a divide-by-two block when the P-bit is low. However, when the P-bit is high then the circuitry shown in FIG. 3a acts as a divide-by-three block. Therefore the circuitry shown in FIG. 3a acts as a 2/3 divider cell, which can be used in a prescaler.

Figure 3B:
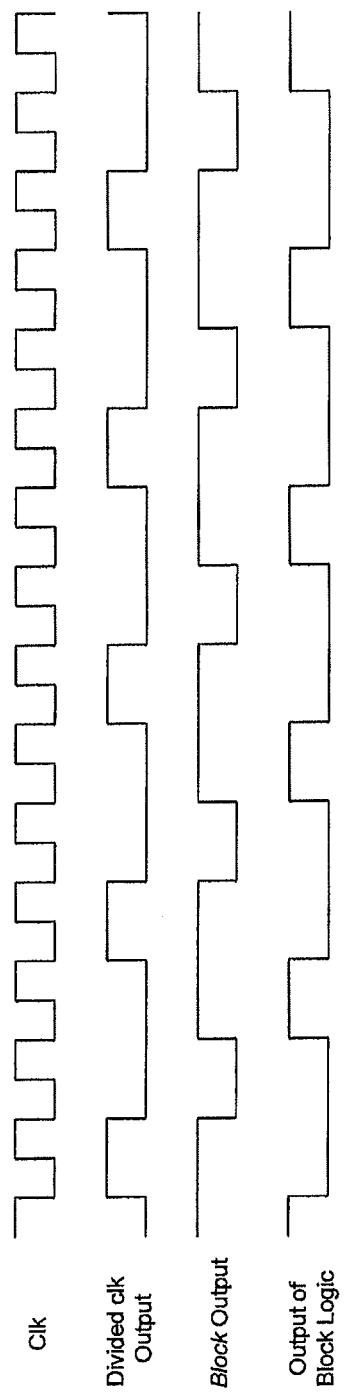
FIG. 3b is a timing diagram of signals in the bit cell 2/3 architecture of FIG. 3a in one mode.

It is clear from FIG. 3b that all of the transitions occur on falling edges of the input clock signal CLK. There is no half cycle operation of the circuitry shown in FIG. 3a. Therefore the output of the circuitry shown in FIG. 3a does not depend upon the duty cycle of the input clock signal CLK. This allows the circuitry to operate at higher maximum speeds. This can be particularly advantageous when the circuitry is used in a prescaler of a digital frequency synthesizer in digital mobile communication devices. The critical path is one flip flop delay, one combo logic delay and the delay for the set up of the next flip flop.

Although FIGS. 3a and 3b show the operation of the circuitry being dependent on the falling edges of the input clock signal CLK, it would be apparent to a skilled person that the circuitry could be modified to be dependent upon the rising edges of the input clock signal rather than the falling edges of the input clock signal. Provided that only one type of edge (i.e. either rising edges or falling edges, but not both) is used by the circuitry shown in FIG. 3a then the output of the circuitry will not be dependent upon the duty cycle of the input clock signal.

In the circuitry shown in FIG. 3a, there is no blocking of the input clock signal. The input clock signal is received directly at the flip flops 302 and 304 without being blocked. Since the input clock signal is directly received at the flip flops, dedicated start up circuitry is not required. Advantageously, the circuitry will self resolve itself during startup, thereby avoiding stuck states which may occur in the prior art prescalers. Since dedicated start up circuitry is not required, the amount and the complexity of the hardware of the circuitry may be reduced as compared to prescalers of the prior art.

Furthermore, if the programmable P-bit is changed on the fly (i.e. during operation of the circuitry shown in FIG. 3a) then glitches are not produced on the Divided clk output or on the block output signal. Changing the P-bit on the fly may cause intermediate frequencies to be received at the data input of the flip flop 302. However, since the first flip flop 302 is clocked using the input clock signal, the output of the first flip flop 302 does not contain the higher frequencies than the range of the prescaler. The delay between changing the P-bit and the logic block 308 reaching a steady state is the delay in the logic block 308 plus the delay of the second flip flop 304 plus the setup time of the first flip flop 302, which is advantageously less than the period of the input clock signal CLK. Therefore, the glitches are not passed from the data input of the first flip flop 302 to the output of the first flip flop 302. Therefore, no additional circuitry is required to allow the P-bit to be changed on the fly.

It will be appreciated that the circuitry shown in FIG. 3(a) when placed in series as explained below with reference to FIG. 5 outputs a clock signal (the block output signal) at the output of the second Flip Flop 304 which may not have 50% duty cycle. For example, in the case of divide by 5, we will have one time period of the input clock signal CLK of HIGH time and four time periods of the input clock signal CLK of LOW time (or vice versa), which means a duty cycle of 20% (or 80%). So, as described later with reference to FIG. 5 the first bit cell (the left most) includes circuitry as described below in relation to FIG. 4a for producing a final output signal with a duty cycle closer to 50%.

Figure 4A:
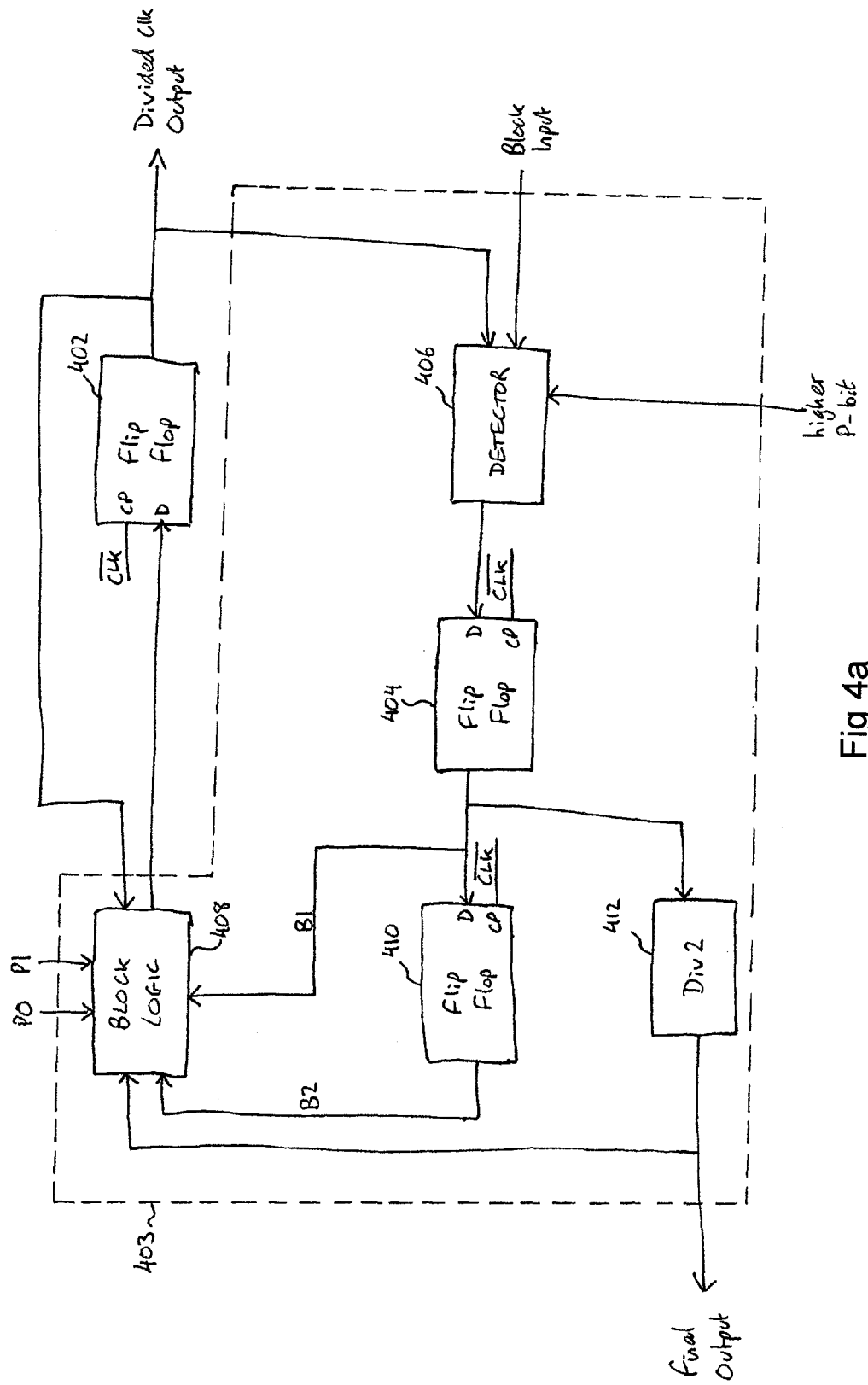
FIG. 4a shows a 50 D bit cell architecture according to another embodiment.

FIG. 4a shows modified circuitry to that shown in FIG. 3a which outputs a clock signal having substantially a 50% duty cycle. It can be advantageous to output a clock signal having a 50% duty cycle (a 50 D signal) because some other components (to which the output clock signal may be provided) may be sensitive to variations in the duty cycle of the clock signal.

FIG. 4a shows a first flip flop 402, a second flip flop 404, a detector block 406 and block logic 408, which correspond to, and are configured correspondingly to, the first flip flop 302, second flip flop 304, detector block 306 and block logic 308 shown in FIG. 3a. Therefore, the first flip flop 402 is clocked using the inverted input clock signal $\overline{CLK}$. The output of the block logic 408 is coupled to the data input of the first flip flop 402. The first flip flop 402 provides a Divided clk output signal. The Divided clk output signal is coupled to the block logic 408. The Divided clk output signal is also coupled to the detector block 406. The block input signal is coupled to the detector block 406. The output of the detector block 406 is coupled to the data input of the second flip flop 404. The second flip flop 404 is clocked using the inverted input clock signal $\overline{CLK}$. A signal providing an indication of other "higher" programmable bits may be input to the detector block 406. This signal (denoted "higher P-bit" in FIG. 4a) is used when the cell shown in FIG. 4a is part of a series of cells as described in more detail below in relation to FIG. 5.

The circuitry of FIG. 4a also includes a third flip flop 410 and a divide-by-two block 412.

The output (B1) of the second flip flop 404 is coupled to the data input of the third flip flop 410. The output of the second flip flop 404 is also coupled to the block logic 408 and to the divide-by-two block 412. The inverse of the input clock signal $\overline{CLK}$ is coupled to the clock input of the third flip flop 410. The output (B2) of the third flip flop 410 is coupled to the block logic 408.

The output of the divide-by-two block 412 provides a final output signal. The output of the divide-by-two block 412 is also coupled to the block logic 408. The block logic 408 is arranged to receive two programmable control bits (P0 and P1).

The circuitry shown in FIG. 4a other than the first flip flop 402 can be thought of as feedback circuitry, as shown in dotted box 403. In operation the feedback circuitry acts such that the block logic 408 provides either an inverted version of the output of the first flip flop to 402 or a block output signal (B1 or B2) to the data input of the first flip flop 402 in dependence upon the value of the P-bits and the block input signal.

The circuit shown in FIG. 4a will alter the frequency of the Divided clk output signal from the first flip flop 402 (and thereby also alter the frequency of the signal on the final output from the divide-by-two block 412) in dependence upon the values of P0 and P1 as described below.

Figure 4B:
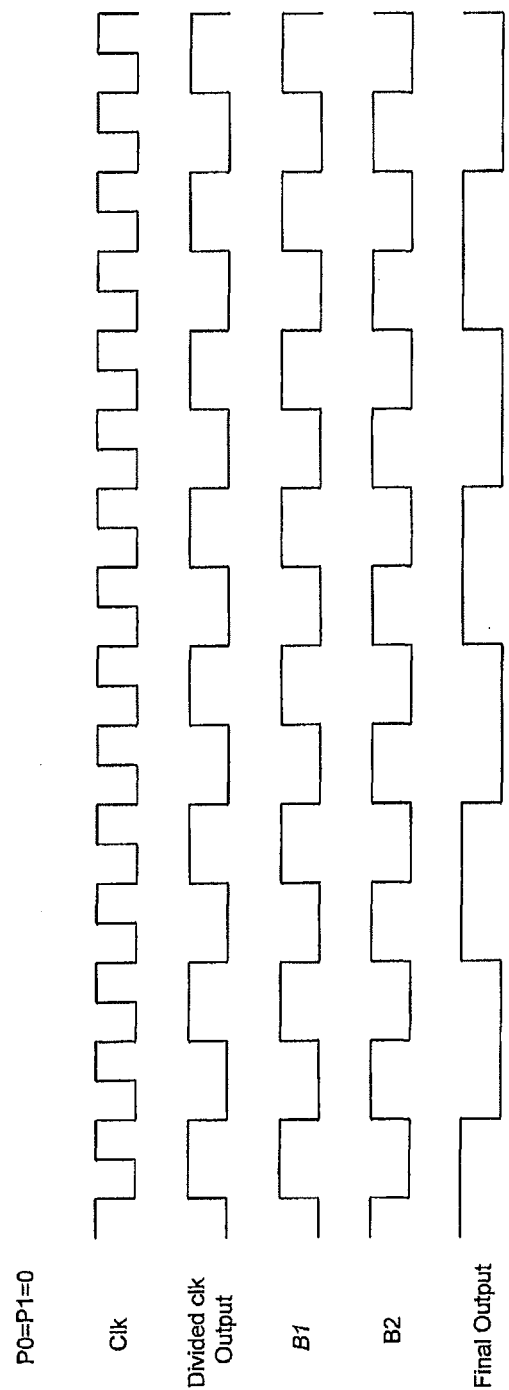
FIG. 4b is a timing diagram of signals in the 50 D bit cell architecture of FIG. 4a in a first mode.

If p0=p1=0 (i.e. p0 and p1 are "low") then the final output signal has a clock frequency which is a quarter of the frequency of the input clock signal CLK, and has a 50% duty cycle. FIG. 4b shows a timing diagram of the Divided clk output signal, B1, B2 and the final output signal. The block logic 408 is arranged such that when P0=P1=0 then the output of the block logic 408 to the data input of the first flip flop 402 follows the inverse of the output of the first flip flop 402. Therefore when P0=P1=0, the circuit shown in FIG. 4a operates in the same way as FIG. 3a operates when the P-bit is low. In other words, the Divided clk output signal has a frequency which is half of the frequency of the input clock signal CLK. This means that as shown in FIG. 4b the signal B1 also has a frequency which is half of the frequency of the input clock signal CLK. The divide-by-two block 412 operates to divide the frequency of the B1 signal by two. Therefore, as shown in FIG. 4b the final output signal from the divide-by-two block 412 has a frequency which is a quarter of the frequency of the input clock signal.

Figure 4C:
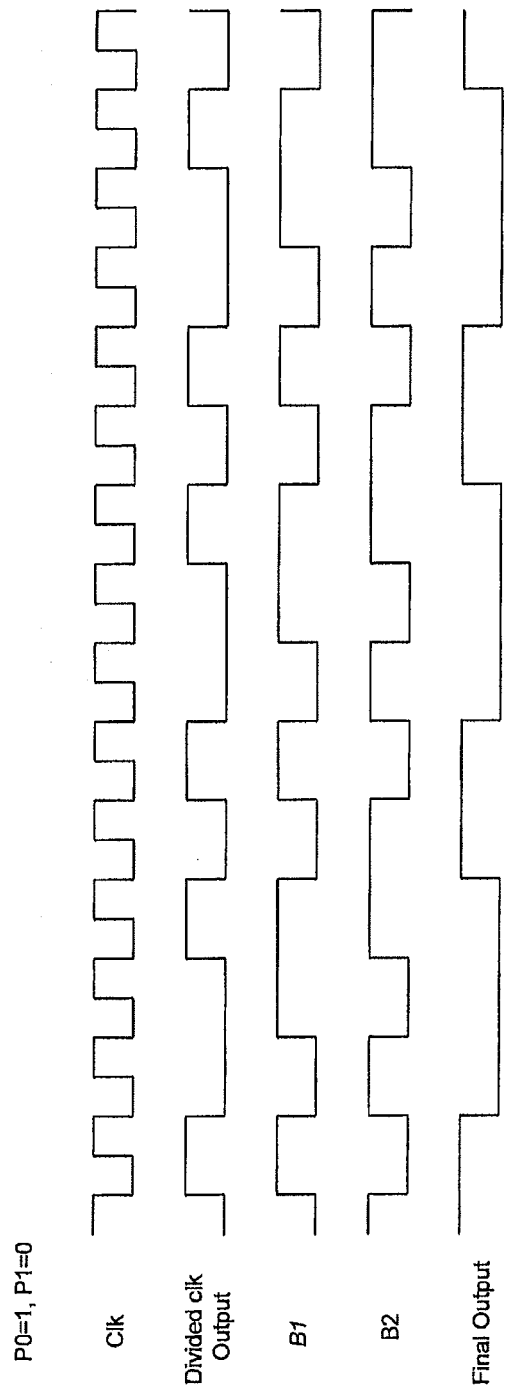
FIG. 4c is a timing diagram of signals in the 50 D bit cell architecture of FIG. 4a in a second mode.

The block logic 408 is arranged such that if p1=0 and p0=1 then the input clock signal is blocked once per cycle, such that the signal provided as the final output from the divide-by-two block 412 has a clock frequency which is a fifth of the frequency of the input clock signal CLK, and has a duty cycle which is near to 50%. FIG. 4c shows a timing diagram of the Divided clk output signal, B1, B2 and the final output signal when P1=0 and P0=1. The block logic 408 is arranged such that in the mode when P0 is 1 (and P1 is 0) the output of the block logic 408 is held low when B1 and the final output signals are low, but otherwise the output of the block logic 408 follows the inverse of the output of the first flip flop 402. This can be seen in FIG. 4c in that the output of the first flip flop 402 (Divided clk output) changes on every falling edge of the input clock signal except when the B1 and final output signals are both low. This results in the Divided clk output signal having an average frequency which is 2.5 times less than the frequency of the input clock signal. Actually, as shown in FIG. 4c the frequency of the divided clk signal alternates between being a half of the frequency of the input clock signal and a third of the frequency of the input clock signal, such that five periods of the input clock signal has a duration equal to two periods of the Divided clk output signal. The final output signal therefore has a frequency which is five times less than the frequency of the input clock signal CLK.

Figure 4D:
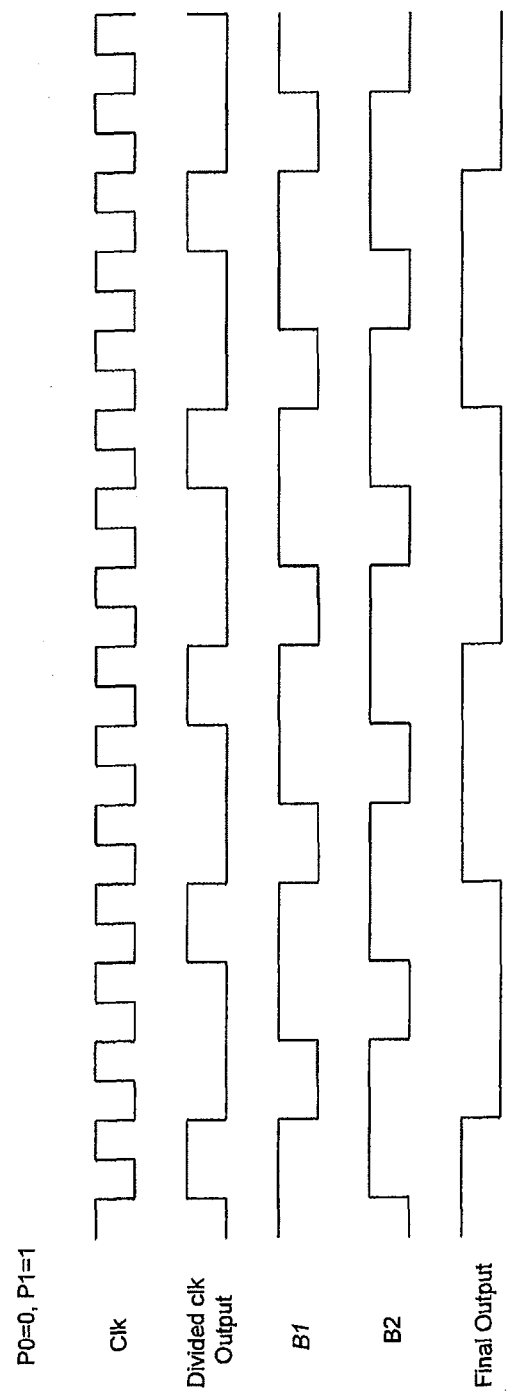
FIG. 4d is a timing diagram of signals in the 50 D bit cell architecture of FIG. 4a in to a third mode.

The block logic 408 is arranged such that if p1=1 and p0=0 then the input clock signal is blocked twice per cycle, such that the signal provided as the final output from the divide-by-two block 412 has a clock frequency which is a sixth of the frequency of the input clock signal CLK, and has a 50% duty cycle. FIG. 4d shows a timing diagram of the Divided clk output signal, B1, B2 and the final output signal when P1=1 and P0=0. The block logic 408 is arranged such that in the mode when P1 is 1 (and P0 is 0) the output of the block logic 408 is held low when B1 is low, but otherwise the output of the block logic 408 follows the inverse of the output of the first flip flop 402. This can be seen in FIG. 4d in that the output of the first flip flop 402 (Divided clk output) changes on every falling edge of the input clock signal except when the B1 signal is low. This results in the Divided clk output signal having a frequency which is three times less than the frequency of the input clock signal. The final output signal therefore has a frequency which is six times less than the frequency of the input clock signal CLK.

Figure 4E:
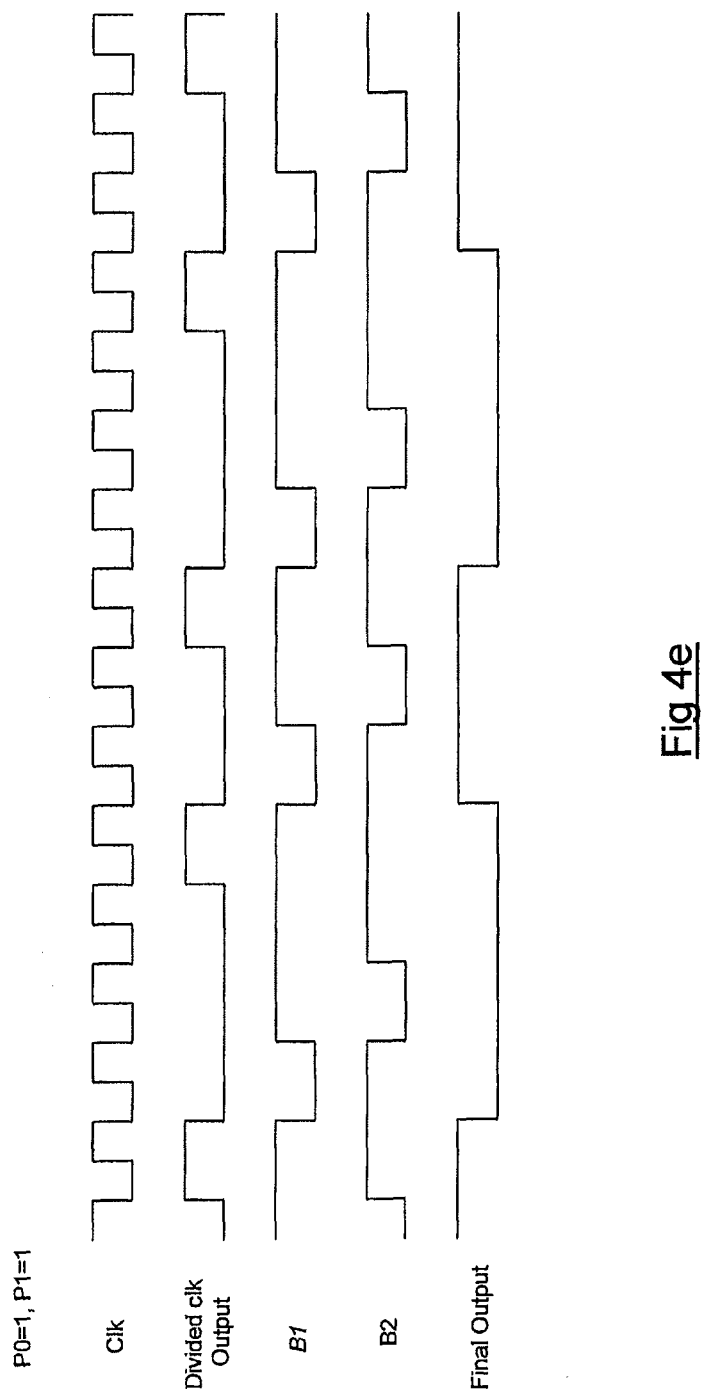
FIG. 4e is a timing diagram of signals in the 50 D bit cell architecture of FIG. 4a in a fourth mode.

The block logic 408 is arranged such that if p1=1 and p0=1 then the input clock signal is blocked three times per cycle, such that the signal provided as the final output from the divide-by-two block 412 has a clock frequency which is a seventh of the frequency of the input clock signal CLK, and has a duty cycle which is near to 50%. FIG. 4e shows a timing diagram of the Divided clk output signal, B1, B2 and the final output signal when P1=1 and P0=1. The block logic 408 is arranged such that in the mode when P0 is 1 and P1 is 1 the output of the block logic 408 is held low when B1 is low or when B2 and the final output signals are both low, but otherwise the output of the block logic 408 follows the inverse of the output of the first flip flop 402. This can be seen in FIG. 4e in that the output of the first flip flop 402 (Divided clk output) changes on every falling edge of the input clock signal except when the B1 signal is low or when both the B2 and final output signals are low. This results in the Divided clk output signal having an average frequency which is 3.5 times less than the frequency of the input clock signal. Actually, as shown in FIG. 4e the frequency of the divided clk signal alternates between being a third of the frequency of the input clock signal and a quarter of the frequency of the input clock signal, such that seven periods of the input clock signal has a duration equal to two periods of the Divided clk output signal. The final output signal therefore has a frequency which is seven times less than the frequency of the input clock signal CLK.

As described above, a "cycle" has a duration which is equal to the time period of the final output from the divide-by-two block 412. The precise implementation of the block logic 408 is not described in detail here, but a skilled person would be aware of a number of different arrangements which would operate as described above such that the output of the block logic 408 changes in accordance with the changes to the inputs to the block logic 408 as described above.

The use of the divide-by-two block 412 to provide the final output signal from the module shown in FIG. 4a means that the final output has substantially a 50% duty cycle. When dividing the input clock signal by an even number, n (e.g. where n is 4 or 6) then the duty cycle of the final output signal has a 50% duty cycle, i.e. the high time is the same as the low time of the output signal over a period of the final output signal. This can be seen in FIGS. 4b and 4d. However, when the input clock signal is divided by an odd number then the final output signal does not strictly have a 50% duty cycle. For example, dividing the frequency of the input clock signal by five results in the final output signal having 2 cycles of HIGH TIME and 3 cycles of LOW TIME or vice-versa (as shown in FIG. 4c). In fact, when dividing the frequency of the input clock signal by an odd number n, the duty cycle, D, of the final output signal from the divide-by-two block 412 is given by $$D = \frac{n \pm 1}{2n}.$$

The critical path of the circuitry shown in FIG. 4a is one flip flop delay, two combo delays and setup of the next flip flop.

FIG. 5 shows an example of how multiple divider cells can be combined to provide a high speed 5-bit dual modulus prescaler. FIG. 5 shows three divider cells 502 to 506, a clock input pin 508 for receiving the input clock signal and an output pin 510 for providing the output of the 5-bit dual modulus prescaler. In this way the modular frequency divider shown in FIG. 5 comprises a sequence of divider cells connected in series.

The first divider cell 502 is a SOD bit cell such as that shown in FIG. 4a and described above. The second and third divider cells 504 and 506 are 2/3 bit cells such as that shown in FIG. 3a and described above.

The input clock signal is received at the clock input of the first divider cell 502 from the input pin 508. The control bits p0 and p1 are received at the first divider cell 502. The values of p0 and p1 determine whether the first divider cell divides the input clock signal by 4, 5, 6 or 7. In this sense the control bits p0 and p1 act as a binary representation of x where the input clock frequency is divided by (4+x) by the first divider cell 502.

The second divider cell 504 receives the Divided clk output signal from the first divider cell 502 which is used as the input clock signal in the second divider cell 504. The second divider cell 504 also receives a programmable bit P2 for use as the P-bit described above and shown in FIG. 3a. The block output signal shown in FIG. 3a is output from the second divider cell 504 and used as the block input signal for the first divider cell 502.

The third divider cell 506 receives the Divided clk output signal from the second divider cell 504 which is used as the input clock signal in the third divider cell 506. The third divider cell 506 also receives a programmable bit P3 for use as the P-bit described above and shown in FIG. 3a. The block output signal shown in FIG. 3a is output from the third divider cell 506 and used as the block input signal for the second divider cell 504. A supply voltage is fed into the third divider cell 506 and is used as the block input signal in cell 506 as shown in FIG. 3a.

The modular frequency divider shown in FIG. 5 operates as follows. The Block 2 signal is generated by the third cell 506, and this signal propagates up the sequence of cells being re-clocked by each cell along the way. An active block input signal enables a cell to divide by more than the minimum dividing factor for that cell (the minimum dividing factor is two for cells 504 and 506, and the minimum dividing factor for cell 502 is 4, as described above).

It will be clear to a person skilled in the art that the architecture shown in FIG. 5 could be extended or reduced by adding or removing divider cells as appropriate to provide a prescaler which can divide the input clock signal by different amounts.

The first cell 502 divides the frequency by 4, 5, 6 or 7 depending on the values of P0 and P1. The second and third cells 504 and 506 divide the frequency of their input clock signals by 2 or 3 depending upon the values of P2 and P3.

A higher P-bit_1 signal is received at the first cell 502 and is used to provide an indication of the value of the P-bits which are supplied to the subsequent cells in the sequence. Therefore the higher P-bit_1 signal provides an indication of the values of P2, P3 and P4. In one embodiment the higher P-bit_1 signal is the output of an OR operation applied to P2, P3 and P4. In detector block 406 of cell 502, if the higher p-bit_1 signal is low indicating that none of p2, p3 or p4 are HIGH, then the block input signal (block1) to cell 502 will always be HIGH which means the output of the detector block 406 in cell 502 is the inverse of the divided clk signal output from the first flip flop 402 in cell 502, such that the final output signal will have a frequency which is either 4, 5, 6 or 7 times less than the frequency of the to input clock signal depending on solely p0 and p1. However, if any of p2, p3 and p4 are HIGH (such that the higher P-bit_1 signal is high), then the block input signal may be LOW depending on the values of p2, p3 and p4, such that the output of the detector block 406 in cell 502 will be dependent upon the divided clk signal output from the first flip flop 402 in cell 502 and upon the block input signal received from cell 504. This enables the final output signal to have a frequency which equal to the frequency of the input clock signal divided by any number between 4 and 31 depending on the values of the p-bits (p0 to P4).

Similarly, a higher P-bit_2 signal is received at the second cell 504 and is used to provide an indication of the value of the P-bits which are supplied to the subsequent cells in the sequence. Therefore the higher P-bit_2 signal provides an indication of the values of P3 and P4. In one embodiment the higher P-bit_2 signal is the output of an OR operation applied to P3 and P4. In detector block 306 of cell 504, if the higher p-bit_2 signal is DEACTIVATED that is neither p3 nor p4 are HIGH, then the block input signal (block2) to cell 504 will always be HIGH which means the output of the detector block 306 (block1) in cell 504 is the inverse of the divided clk signal output from the first flip flop 302 in cell 504, and is either 2 or 3 times less than the frequency of the input clock signal received at the cell 504 from the cell 502 depending on solely on p2. However, if either p3 or p4 is HIGH (such that the higher P-bit_2 signal is high), then the block input signal may be LOW depending on the values of p3 and p4, such that the output of the detector block 306 in cell 504 will be dependent upon the divided clk signal output from the first flip flop 302 in cell 504 and upon the block input signal received from cell 506.

Similarly, the P4 bit is received at the third cell 506 and is used as the higher P-bit signal in cell 506.

The result is that the values of P0, P1, P2, P3 and P4 control the frequency of the signal output to pin 510. The minimum factor that the input clock signal can be divided by is four and that is when P0=P1=P2=P3=P4=0, such that the cell 502 does not take account of the blocking performed by cells 504 or 506 (because higher P-bit_1 is low) and the cell 502 divides the frequency of the input clock signal by four. With P2, P3 and P4 low, no blocking is performed by the cells 504 and 506. The frequency of the final output signal to pin 510 is also a quarter of the frequency of the input clock signal when the values of the P-bits P0 to P4 are (00100 respectively).

The maximum factor that the input clock signal can be divided by is thirty one and that is when P0=P1=P2=P3=P4=1. This is achieved because here each cell (502, 504 and 506) is in the blocking mode. In this case there are four divide-by-two blocks enabled. The first divide-by-two block blocks the input clock cycle once, which becomes twice in second divide-by-two block, four times in third divide-by-two block and eight times in last divide-by-two block. So the division of the frequency of the input clock signal is given by 2*2*2*2+1+2+4+8=31. In other words, all the blocking operations lead to addition of cycles which when passed through the individual bit cells enable division of the frequency of the clocks signal.

In summary, there is described above a high speed prescaler with no block in the clock path. No dedicated start up circuitry is required as the architecture self resolves itself. Changing the programmable bits (the p-bits) on the fly will lead to only intermediate frequencies in transit, with no high frequency output glitches being seen. The architecture may be advantageously employed in PLL's due to (i) increased speed (due to lack of dependency on duty cycle of the input clock signal), (ii) no requirement for dedicated startup circuitry, and (iii) no glitches occurring on the output when the p-bits are changed on the fly.

The block logic 308 and 408 described above may be implemented in many ways. In preferred embodiments, the logic blocks 308 and 408 comprise a plurality of transistors (e.g. mosfet transistors) arranged such that the logic blocks 308 and 408 act as described above. It would be apparent to a person skilled in the art that a number of different arrangements may produce logic blocks that operate as described above. Similarly, the detector block 306 and 406 described above may be implemented in many ways. In preferred embodiments, the detector blocks 306 and 406 comprise logic gates arranged such that the detector blocks 306 and 406 act as described above. It would be apparent to a person skilled in the art that a number of different arrangements may produce detector blocks that operate as described above.

While this invention has been particularly shown and described with reference to preferred embodiments, it will be understood to those skilled in the art that various changes in form and detail may be made without departing from the scope of the invention as defined by the appendant claims.

What is claimed is:

1. Circuitry for dividing a frequency of an input clock signal for use in a prescaler of a digital frequency synthesizer, the circuitry comprising:

a flip flop configured to be clocked on a first type of edge of the input clock signal, and configured to provide an output for use as a divided clock signal; and feedback circuitry configured to be clocked on the first type of edge of the input clock signal and configured to:

receive the output of the flip flop;

provide a signal to a data input of the flip flop based on the output of the flip flop; and receive at least one control signal which determines a mode of the circuitry, wherein in a first mode the feedback circuitry is arranged to allow the signal provided to the data input of the flip flop to follow the inverse of the output of the flip flop so that each first type of edge causes the signal provided to the data input of the flip flop to toggle such that the output of the flip flop has a frequency which is substantially half of the frequency of the input clock signal, and wherein in a second mode the feedback circuitry is arranged to allow the signal provided to the data input of the flip flop to follow the inverse of the output of the flip flop with the exception that toggling of the signal provided to the data input of the flip flop is selectively prevented despite toggling of the output of the flip flop on an edge of the first type such that the output of the flip flop has a frequency which is at most a third of the frequency of the input clock signal, wherein the feedback circuitry is arranged to operate independently from a second type of edge of the input clock signal in providing the signal to the data input of the flip flop, the second type of edge being the opposite of the first type of edge of the input clock signal, such that the output of the flip flop is independent from the duty cycle of the input clock signal, and wherein the feedback circuitry is arranged to provide a block output signal and comprises a divide-by-two block for dividing the block output signal by two to thereby provide a final output signal.

2. The circuitry of claim 1 arranged such that the input clock signal is received directly at the flip flop without being blocked.

3. The circuitry of claim 1, wherein the feedback circuitry is arranged such that in the second mode toggling of the signal provided to the data input of the flip flop is prevented at least once per cycle.

4. The circuitry claim 1, wherein the at least one control signal comprises a programmable bit which is selectable to thereby select the mode of the circuitry.

5. A modular frequency divider comprising a sequence of cells connected in series, the plurality of cells comprising:

a first cell and at least one second cell comprising the circuitry of claim 1;

wherein the divided clock signal output from the flip flop of the circuitry of the first cell is arranged to provide the input clock signal for a first of the at least one second cell in the sequence, and wherein the block output signal from the first of the at least one second cell is arranged to provide one of the at least one control signals to the feedback circuitry of the first cell.

6. A method of dividing the frequency of an input clock signal for use in a prescaler of a digital frequency synthesizer, the method comprising:

clocking, in a first stage of frequency dividing circuitry, a first flip flop on a first type of edge of the input clock signal, to provide an output for use as a first divided clock signal;

using feedback circuitry to provide a signal to a data input of the first flip flop based on at least the output of the first flip flop;

determining a mode of the feedback circuitry wherein in a first mode the signal provided to the data input of the first flip flop is allowed to follow the inverse of the output of the first flip flop so that each first type of edge causes the signal provided to the data input of the first flip flop to toggle such that the output of the first flip flop has a frequency which is substantially half of the frequency of the input clock signal, and wherein in a second mode the signal provided to the data input of the first flip flop is allowed to follow the inverse of the output of the first flip flop with the exception that toggling of the signal provided to the data input of the first flip flop is selectively prevented despite toggling of the output of the first flip flop on an edge of the first type such that the output of the first flip flop has a frequency which is at most a third of the frequency of the input clock signal, wherein the feedback circuitry comprises a detector block configured to receive a block input signal, the divided clock signal, and a programmable bit signal and wherein the output of the first flip flop is independent from the duty cycle of the input clock signal.

7. The method of claim 6, further comprising:

dividing a signal extracted from the feedback circuitry by two; and providing the divided signal as a second divided clock output signal.

8. The method of claim 7, wherein the second divided clock signal is closer to 50% duty cycle than the first divided clock signal.

9. The method of claim 6, wherein the determining comprises providing at least one programmable bit to the feedback circuitry.

10. The method of claim 6, further comprising:

receiving the block input signal at the detector block; and determining an output of the detector block based on the received block input signal.

11. The method of claim 10, wherein the block input signal is received from a second stage of frequency dividing circuitry.

12. The method of claim 11, further comprising providing the first divided clock signal to the second stage of frequency dividing circuitry.

13. Frequency dividing circuitry comprising:

a first flip flop configured to receive a first data input signal and an input clock signal and to provide a first divided clock signal;

a detector block configured to receive a block input signal and the first divided clock signal;

a second flip flop configured to receive a first output signal from the detector block and the input clock signal; and a block logic unit configured to receive the first divided clock signal, a first programmable bit signal, and a second output signal from the second flip flop, and to provide the first data input signal to the first flip flop.

14. The frequency dividing circuitry of claim 13, wherein the first divided clock signal toggles responsive to only a first type edge of the input clock signal.

15. The frequency dividing circuitry of claim 13, wherein a frequency of the first divided clock signal is determined by a value of the first programmable bit signal.

16. The frequency dividing circuitry of claim 13, wherein the detector block is further configured to receive a second programmable bit signal.

17. The frequency dividing circuitry of claim 13, further comprising a divide-by-two block configured to receive the second output signal and provide a second divided clock signal.

18. The frequency dividing circuitry of claim 17, further comprising a third flip flop configured to receive the second output signal and provide a third output signal to the block logic unit.

19. The frequency dividing circuitry of claim 17, wherein the block logic unit is further configured to receive the second divided clock signal.

20. The frequency dividing circuitry of claim 19, wherein the block logic unit is further configured to receive a third programmable bit signal.

21. The frequency dividing circuitry of claim 13, configured as a first cell, coupled in sequence to a second cell that comprises the frequency dividing circuitry of claim 13.

22. The frequency dividing circuitry of claim 21, wherein the first divided clock signal from the first cell is coupled as the input clock signal to the second cell.

23. The frequency dividing circuitry of claim 21, wherein the second output signal from the second cell is coupled as the block input signal to the detector block of the first cell.

* * * * *

UNITED STATES PATENT AND TRADEMARK OFFICE
CERTIFICATE OF CORRECTION

PATENT NO. : 8,466,720 B2
APPLICATION NO. : 13/177956
DATED : June 18, 2013
INVENTOR(S) : Nitin Gupta Page 1 of 1

Figure 1A:
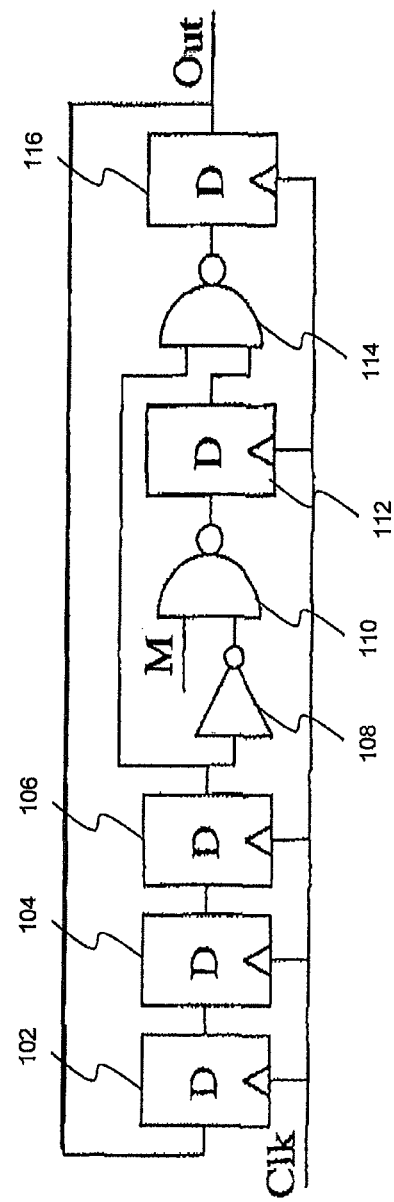
FIG. 1a shows a dual modulus 8/9 prescaler based on a shift register ring.
Figure 1B:
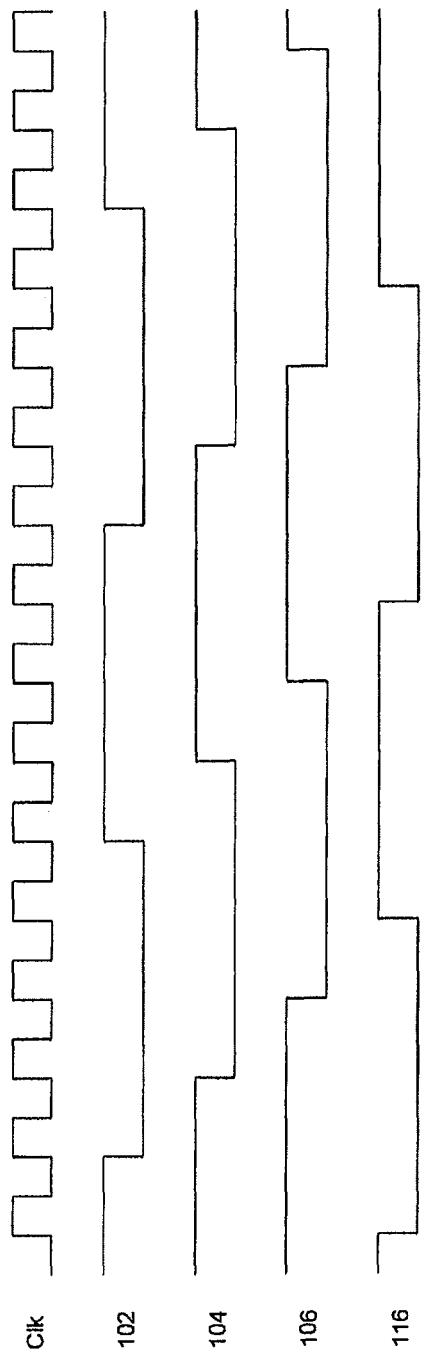
Figure 1C:
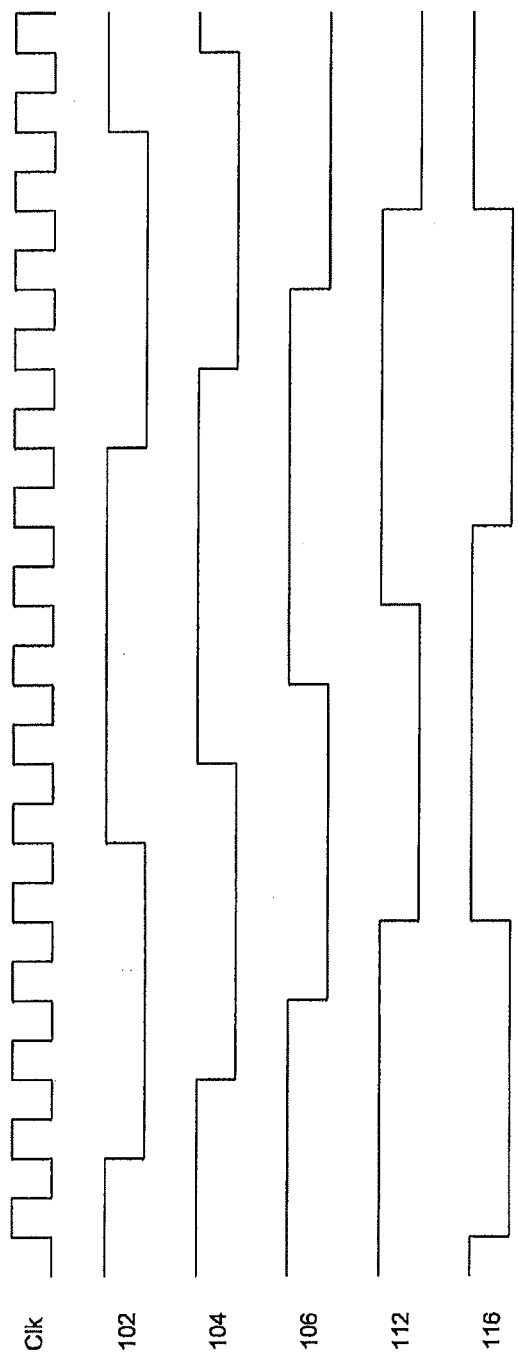
Figure 2A:
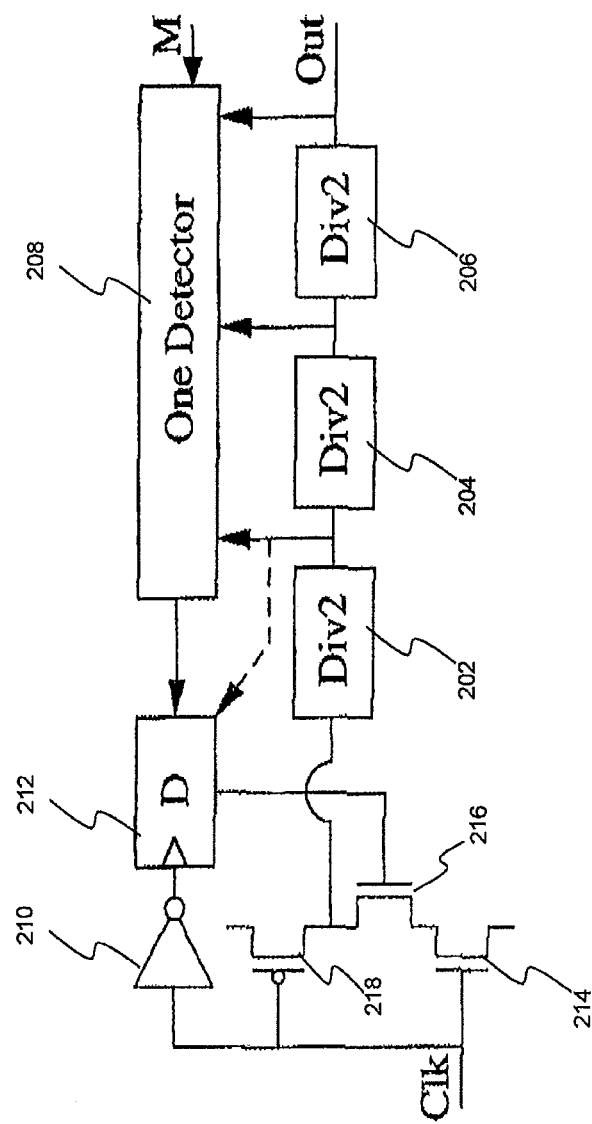
FIG. 2a shows another dual modulus 8/9 prescaler with preprocessing of the clock signal.
Figure 2B:
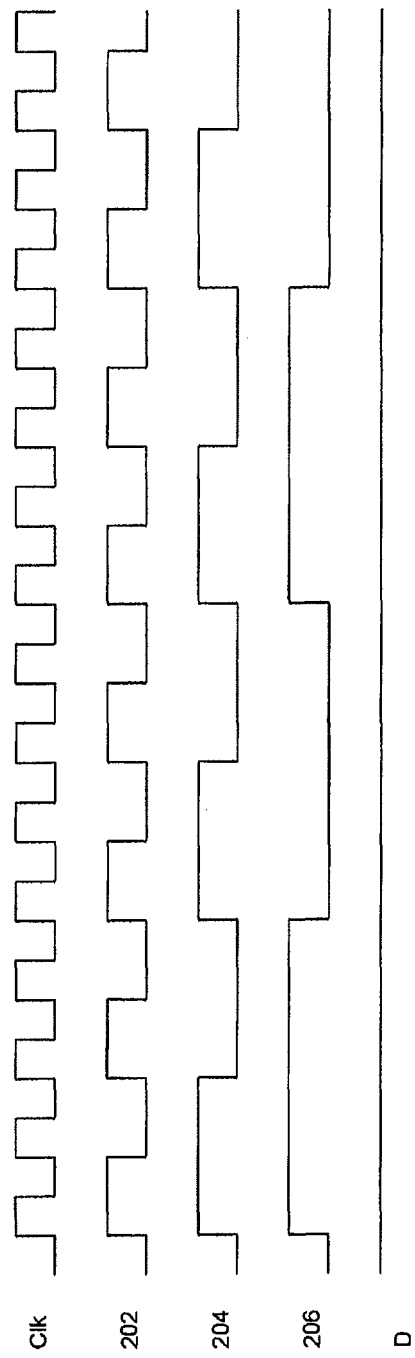
Figure 2C:
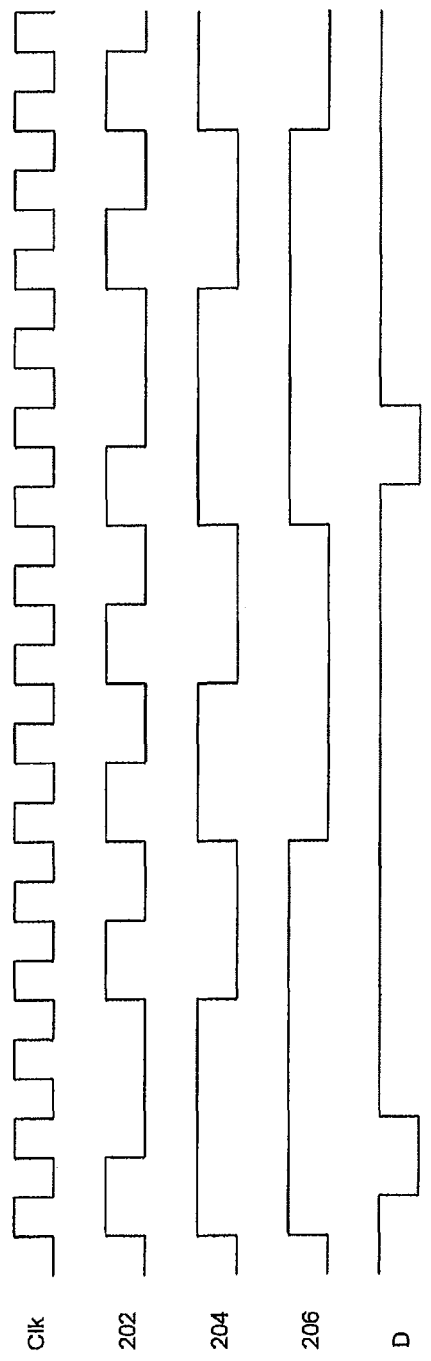

It is certified that error appears in the above-identified patent and that said Letters Patent is hereby corrected as shown below:

In the Specifications:

Col. 1, line 41, should read:
104, 106, 112 and 116) shown in Fig. 1a are initialized to output high Signed and Sealed this
Thirteenth Day of August, 2013

Teresa Stanek Rea
*Acting Director of the United States Patent and Trademark Office*